(12) United States Patent
Rocci et al.

(10) Patent No.: US 7,970,560 B2
(45) Date of Patent: Jun. 28, 2011

(54) METHOD AND APPARATUS FOR MEASURING AND MONITORING A POWER SOURCE

(75) Inventors: Joseph D. Rocci, Lansdale, PA (US); Michael L. Quelly, Quakertown, PA (US)

(73) Assignee: Phoenix Broadband Technologies, LLC, Montgomeryville, PA (US)

( * ) Notice: Subject to any disclaimer, the term of this patent is extended or adjusted under 35 U.S.C. 154(b) by 402 days.

(21) Appl. No.: 12/089,745

(22) PCT Filed: Oct. 11, 2006

(86) PCT No.: PCT/US2006/039987
§ 371 (c)(1),
(2), (4) Date: Aug. 26, 2008

(87) PCT Pub. No.: WO2007/044872
PCT Pub. Date: Apr. 19, 2007

(65) Prior Publication Data
US 2008/0312853 A1      Dec. 18, 2008

Related U.S. Application Data

(60) Provisional application No. 60/725,244, filed on Oct. 11, 2005.

(51) Int. Cl.
*G01R 21/06*      (2006.01)

(52) U.S. Cl. .............. 702/60; 702/182; 702/189
(58) Field of Classification Search ............... 714/22; 713/340; 702/60, 182, 189; 320/116, 136
See application file for complete search history.

(56) References Cited

U.S. PATENT DOCUMENTS

| | | | | |
|---|---|---|---|---|
| 5,119,011 | A | * | 6/1992 | Lambert ............... 320/136 |
| 6,137,267 | A | | 10/2000 | Kates et al. |
| 7,166,384 | B2 | * | 1/2007 | LaFollette et al. ....... 429/122 |

* cited by examiner

*Primary Examiner* — Mohamed Charioui
*Assistant Examiner* — Elias Desta
(74) *Attorney, Agent, or Firm* — Woodcock Washburn LLP

(57) ABSTRACT

A system and method for monitoring a power source using a site controller (905) and first and second sensors. The system includes a first power source in communication with a second power source. The system further includes a first sensor in communication with the first power source and the first sensor calculates an exponential discharge characteristic of the first power source. The system further includes a second sensor in communication with the second power source and the second sensor calculates an exponential discharge characteristic of the second power source (902). The system further includes a controller in communications with the first sensor via the second sensor wherein the controller determines the characteristics of the first power source as a function of the exponential discharge characteristic of the first power source (901).

36 Claims, 9 Drawing Sheets

METHOD AND APPARATUS FOR MEASURING AND MONITORING A POWER SOURCE

CROSS-REFERENCE TO RELATED APPLICATIONS

This application is the National Stage of International Application No. PCT/US2006/039987 filed Oct. 11, 2006, which claims the benefit of U.S. Provisional Application No. 60/725,244, filed Oct. 11, 2005, the disclosure of which is incorporated herein by reference in its entirety.

BACKGROUND

Generally the communications and computing equipment in telecommunication central offices, datacenters, and wireless network cell sites require a −48V DC (direct current) or −24V DC power source, and some data equipment require AC power. Typically, the commercial AC power feed that supplies a site is converted to DC to appropriately match the requirements of the individual equipment.

Because commercial AC power is not always reliable enough for telecommunication systems and mission critical business information systems, it is common to provide backup power in the event of a failure of the commercial feed. The backup power is typically provided by a collection of power sources or electrochemical batteries, known as a battery plant. The batteries may be located within an uninterruptible power supply (UPS) or centrally located within the site and coupled with power distribution bars, to feed DC equipment, and inverters, to feed AC equipment. Regardless of where the batteries are located, they are often oriented in groups, wired in series up to a required voltage.

In order to obtain the maximum battery run-time and life expectancy, it is necessary to perform periodic maintenance tests. These tests are commonly performed by maintenance personnel who travel to the remote site and, using complex and expensive equipment, take measurements and readings from the batteries. This work is made more difficult when the sites are located in remote geographic areas. In order to increase battery plant reliability and lower maintenance costs, it is desirable to perform these tests more often and perhaps without physically dispatching maintenance personnel.

SUMMARY

The disclosed embodiments include a system and method for monitoring a power source. The novel system includes a first power source that is in communication with a second power source. The system further includes a first sensor in communication with the first power source. The first sensor calculates an exponential discharge characteristic of the first power source. The system further includes a second sensor in communication with the second power source. The second sensor calculates an exponential discharge characteristic of the second power source. Also, the system includes a controller in communication with the first sensor via the second sensor. The controller determines characteristics of the first power source as a function of the exponential discharge characteristic of the first power source.

DETAILED DESCRIPTION OF ILLUSTRATIVE EMBODIMENTS

Figure 1:
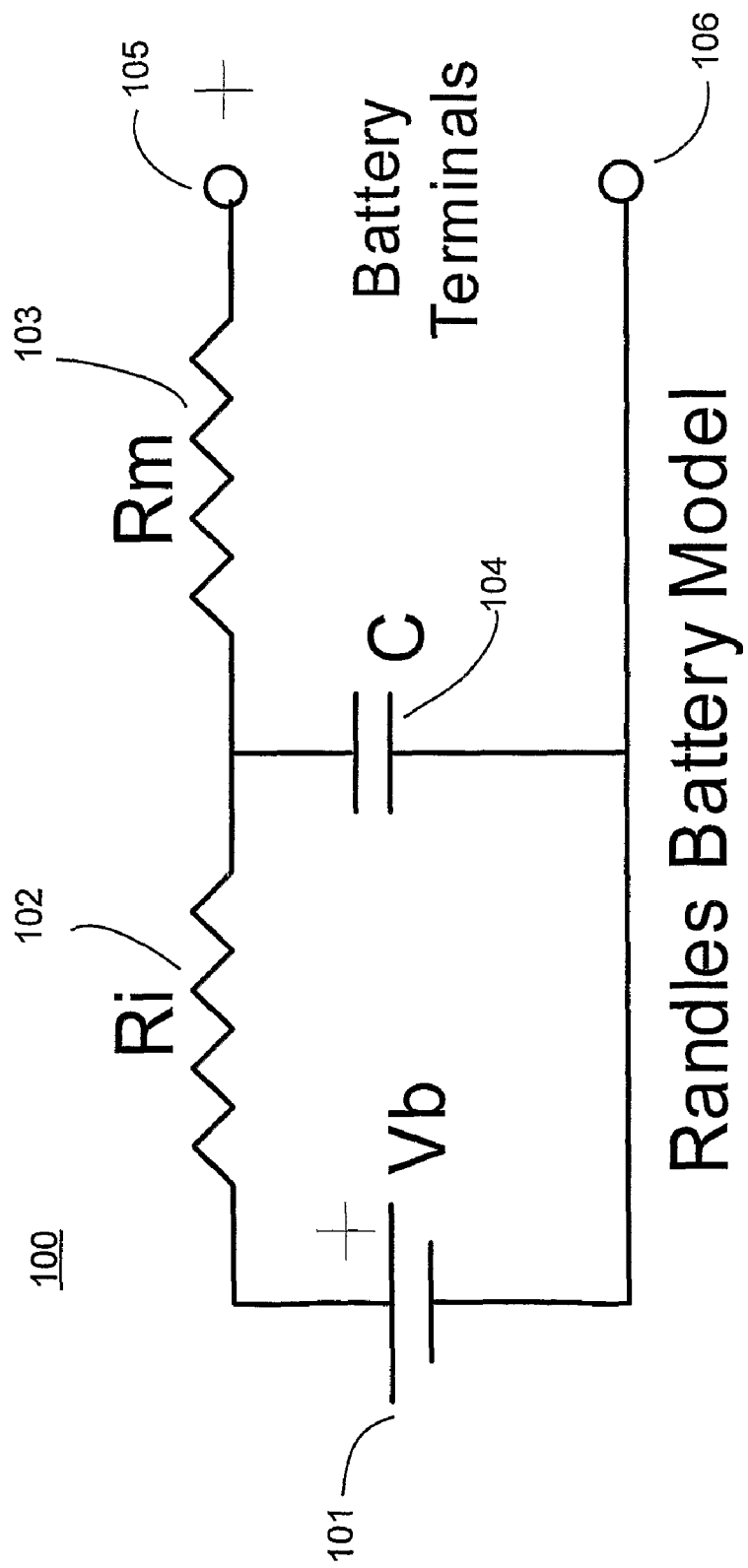
FIG. 1 is a circuit diagram of a battery model.

FIG. 1 is a circuit diagram of the Randles battery model 100. The Randles battery model 100 is a mathematical battery model that characterizes the electrical properties and behavior of a real battery. The Randles battery model 100 is a commonly accepted simplified model of an electrochemical battery. It consists of an ideal voltage source (Vb) 101, a resistance element (Ri) 102 connected in series to the positive side of Vb 101, a capacitive element (C) 104 in parallel with Vb 101 and Ri 102, and a resistance element Rm 103 connected at one node to both Ri 102 and C 104. Connected to the opposite side of Rm 103 is a positive node 105. Connected to the negative side of Vb 101 and C 104 is a negative node 106.

The Randles battery model is only one of many acceptable battery models. Other arrangements of Ri 102, Rm 103, and C 104 are sometimes used, but the resultant performance can be shown to be roughly equivalent. The disclosed embodiments contemplate other battery models, the Randles battery model is presented as an example.

In this model, Ri 102 represents an equivalent internal resistance attributable to the voltage source. Rm 103 represents the resistance due to metallic connections. In addition to these resistances, there may be an equivalent internal capacitance represented by C 104. In practical applications of lead-acid batteries with capacities of 100-200 ampere-hours, Ri 102 and Rm 103 may be roughly equal with a combined resistance typically in the range of 0.1 milliohm to 1.0 milliohm, and C 104 is typically in the range of 1.0 to 2.0 Farads per 100 ampere-hours of capacity.

Figure 2:
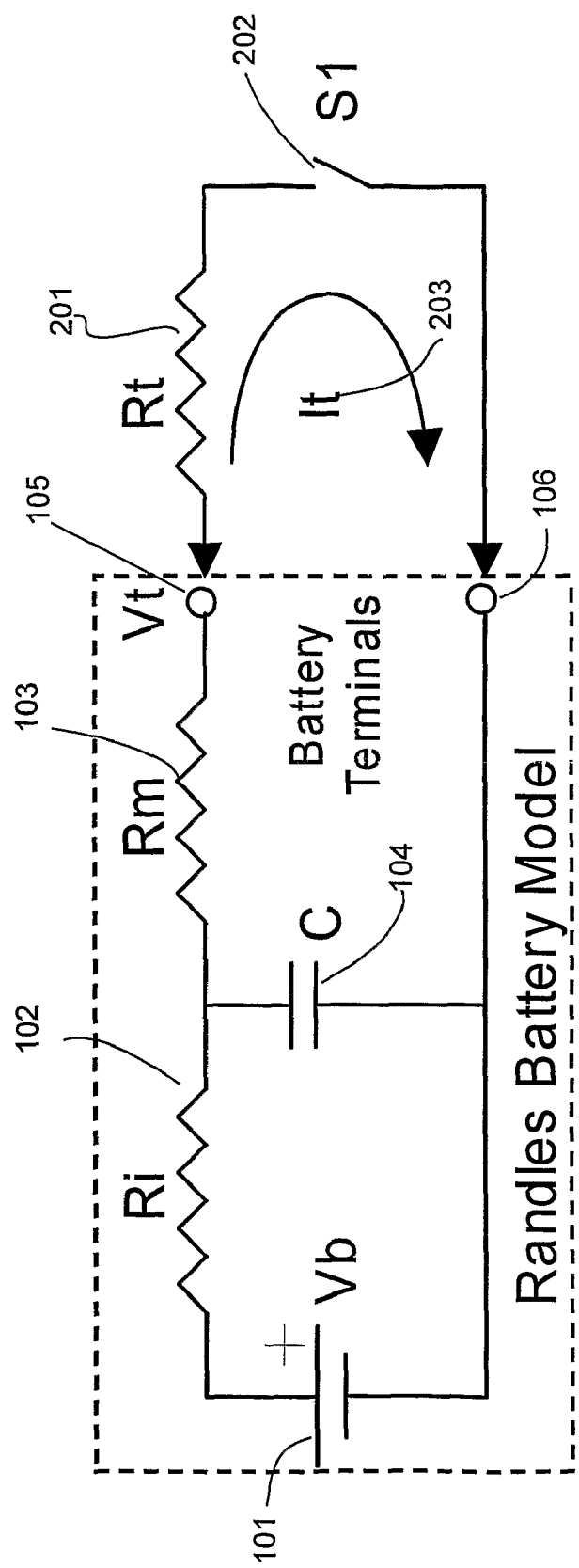
FIG. 2 is a circuit diagram of battery model test circuit.

It is possible to calculate the values of the Randles model, and other battery models, by applying and then removing a DC load of known current while observing the time-dependent voltage change at the battery terminals. FIG. 2 is a circuit diagram of exemplary battery model test circuit based on the Randles model.

In FIG. 2, a fixed external resistive load Rt 201 in series with a switch 202 may be applied between the positive node 105 and the negative node 106. When the switch 202 is in the open position C 104 may charge to a voltage equivalent to that of Vb 101. The switch 202 may be closed at a time t0, and C 104 may supply an instantaneous current (It) 203 generally consistent with the following:

$$It = \frac{Vb}{Rm + Rt}$$

If Rt 201 is selected to be very large compared to any expected value of Rm 103, then the value of It 203 may be simplified to:

$$It = \frac{Vb}{Rt}$$

Figure 3:
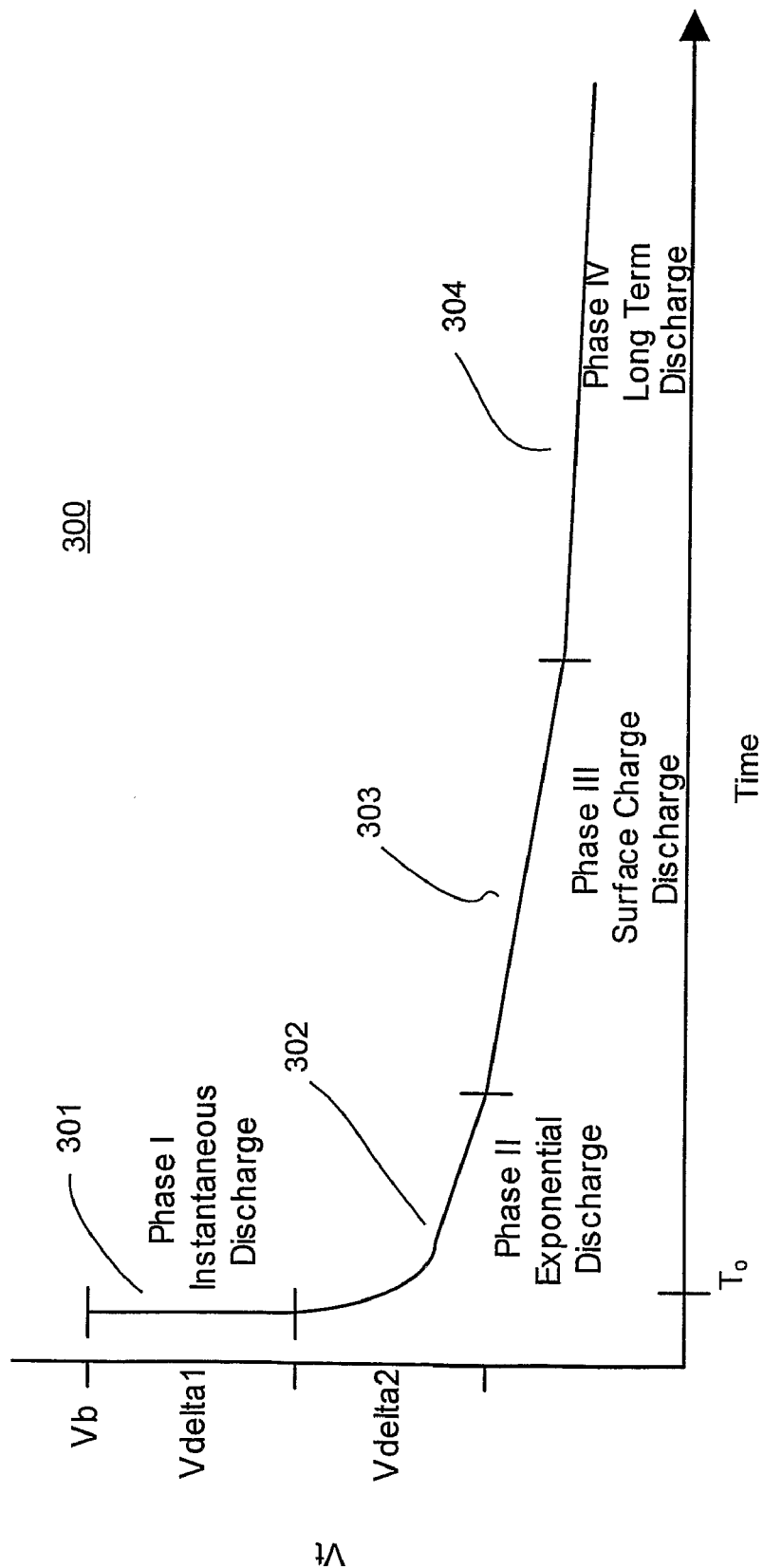
FIG. 3 depicts a typical discharge profile.

The value of It 203 over time may be used to develop a discharge profile. FIG. 3 depicts a exemplary discharge profile 300. The profile 300 shows the value of voltage Vt as measured between positive node 105 and negative node 106 over time after t0. Phase I 301 of the discharge profile represents the instantaneous drop in voltage Vdelta1 that may be calculated by:

$$Vdelta1 = 2 \cdot It \cdot Rm$$

After the Phase I 301 discharge interval, the voltage Vt will continue to drop in the well-known exponential manner of RC circuits until a steady-state value of Vt is reached. This exponential discharge period is depicted in the discharge profile as Phase II 302 discharge. The amount of voltage drop during this interval is Vdelta2 and may be calculated as a function of the values of Ri 102, Rm 103, and It 203:

$$Vdelta2 = It \cdot (Rm + Ri)$$

It may be assumed that Rm 103 is approximately equal to Ri 102. As a result, the calculation for Vdelta2 may be simplified to:

$$Vdelta2 = 2 \cdot It \cdot Rm$$

Note that Vdelta2 may be approximately equal to Vdelta1. After the completion of the Phase II 302 discharge interval, Vt may continue to decline at a much slower rate due to depletion of the surface charge which is characteristic of lead-acid batteries. The rate of decline of Vt during this period is depicted as Phase III 303 discharge. It is reasonable to assume throughout the Phase III 303 interval, the change of Vt may be essentially linear over short time intervals. After the Phase III 303 surface charge depletion interval is complete, the battery may then enter an interval of long-term discharge depicted as Phase IV 304 discharge.

The characteristics as calculated by a battery model may be used to characterize the battery's internal parameters. Such a characterization may be used to establish a set of metrics which may be indicative of the battery's health and the battery's ability to deliver power to a load.

Figure 4:
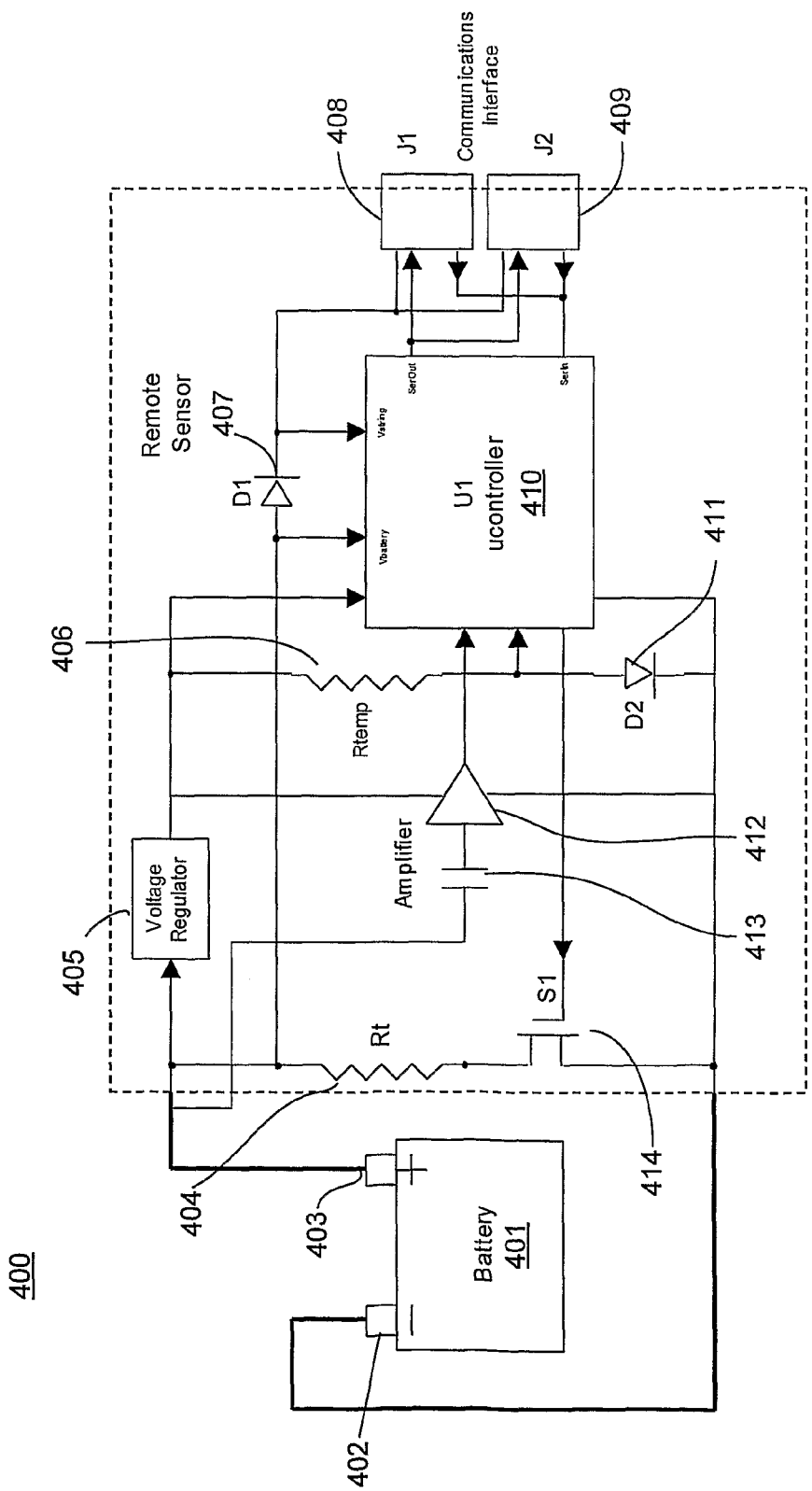
FIG. 4 is a circuit diagram of an exemplary remote measurement sensor.

FIG. 4 is a circuit diagram of an illustrative remote measurement sensor 400. The remote measurement sensor 400 is merely one embodiment; other circuits that measure similar parameters are contemplated. The remote measurement sensor 400 may include a battery 401 under test. The positive terminal 403 of battery 401 may be connected to a first node of a resistive load 404 with a resistance value of Rt. The second node of the resistive load 404 may be connected to one contact of a switch 414, with the second contact of the switch connected to the negative terminal 402 of battery 401. Switch 414 may be a single pole single throw switch and may open and close current flow from battery 401 across the resistive load 404. Switch 414 may be controllable such a FET switch implementation, for example.

One node of a capacitor 413 may be connected to the positive terminal of the battery 401, the other node of the capacitor 413 may be connected to the input of a voltage amplifier 412. The voltage amplifier 412, amplifies changes in voltage Vt measured at the positive terminal 403 of the battery 401 with respect to the negative terminal 402 of the battery 401.

The output of the voltage amplifier 412 may be input to a microcontroller 410. Microcontroller 410 may be a single-chip microcontroller and may include a built-in analog-to-digital converter. Microcontroller 410 may also include a dual-port optically isolated serial communications interface with a first port 408 and a second port 409.

Another aspect of this embodiment may include a diode 407. The anode side of diode 407 may be connected both to the microcontroller 410 and the positive terminal 404 of the battery 401. The cathode side of diode 407 may be connected both to the microcontroller 410 and the first 408 and second 409 communications interface ports. Diode 407 in this arrangement may provide a summing function, such that when remote measurement sensor 400 is placed in a string with other like sensors, remote measurement sensor 400 may determine its position within the string.

Another aspect of this embodiment may include a temperature sensor 406. The temperature sensor 406 may be a resistive load with a resistance value that is variable with temperature. A first node of the temperature sensor 406 may be connected to a voltage regulator 405. A second node of the temperature sensor may be connected to both the microcontroller 410 and the anode side of a diode 411. The cathode side of the diode 411 may be connected to the negative terminal of battery 401. In this arrangement, the DC voltage at the microcontroller is proportional to temperature measured by the temperature sensor 406.

The voltage regulator 405 provides DC power to the remote measurement sensor 400. One node of the voltage regulator 405 may be connected to the positive terminal 403 of the battery 401. The other node of the voltage regulator 405 may be connected to the temperature sensor 406, the voltage amplifier 412 and the microcontroller 410. The voltage amplifier 412 and the microcontroller 410 may also be connected to the negative terminal 402 of battery 401.

The output voltage of amplifier 412, the voltage of temperature sensor 406, and the voltages at both sides of the summing diode 407 may be input to the analog-digital converter in the microcontroller 410. Each voltage may be measured, quantified, and used in the mathematical and logical processes of characterizing the battery 401.

The microcontroller 410 may be programmed to close switch 414, causing a test current (It) to flow from the battery 401 across the resistive load 404. The microcontroller 410, via an analog-digital converter, may quantize an initial measurement of the voltage Vt measured between the positive terminal 403 of battery 401 and the negative terminal 402 of battery 401. The microcontroller 410 then may open switch 414. The microcontroller 410 may measure voltage Vt again. Subtracting the second measurement from the first, the microcontroller may calculate Vdelta1. Using Vdelta1 and the Randles battery model 100 discussed above, or another battery model, the microcontroller may calculate a value representative of Rm 103.

The microcontroller 410 may be pre-programmed with a calibration constant that represents the value of capacitor 104 of the Randles battery model 100. The value of this constant may be determined from the type of battery 401 being tested. The value of the capacitor 104 and the value of Rm 103 may be used to estimate the RC time constant of the battery. Since RC circuits will generally discharge exponentially and stabilize within 5% of the final value in about 10 RC time constants, microcontroller 410 may wait for 10 RC time constants before talking a third measurement of the voltage Vt. Subtracting the third measurement from the second, the microcontroller 410 may determine a value representative of Vdelta2.

Microcontroller may measure Vdelta1 and Vdelta2 multiple times. Microcontroller may cycle switch 414 open and closed repeatedly with a cycle time proportional to the measured RC time constant. This process of adaptive switching intervals allows the remote measurement sensor 400 to make repetitive measurements at a speed that is optimum for the battery 401 being tested.

Each Vdelta1 and Vdelta2 pair may be summed, and the resultant sums may be averaged, producing a value Vtdelta. The values of Vtdelta, Rt, and the pre-programmed calibration constant may be stored in the microcontroller 410 and communicated to a site controller, for example, when the remote measurement sensor 400 is polled via the first port 408 or the second port 409 of the communications interface.

Figure 5:
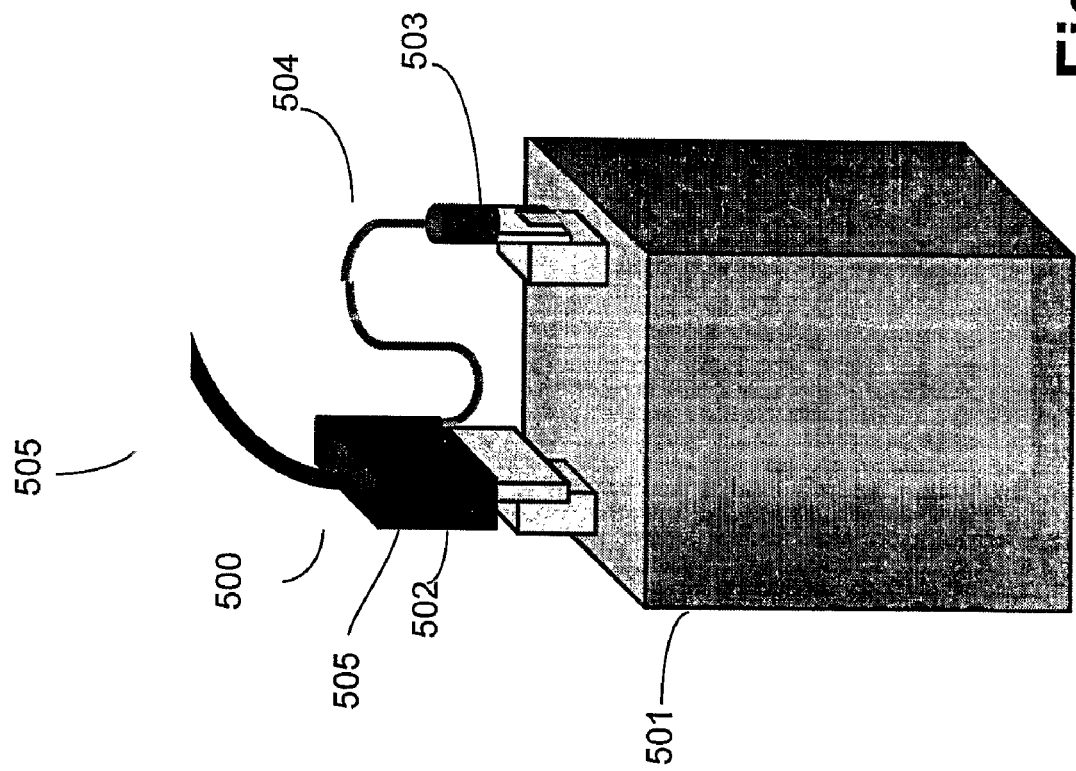
FIG. 5 depicts a perspective view of a remote measurement sensor with battery.

FIG. 5 depicts an embodiment of a remote measurement sensor 400 for testing a battery 501. The remote measurement sensor 400 may be packaged in sensor unit 500. The sensor unit 500 includes a first mounting tab 504 and second mounting tab 505. The first mounting tab 504 may connect to the sensor unit via a 2-conductor wire terminated with a wire lug, for example. The second mounting tab 505 may extend from the body of sensor unit 500. Each mounting tab may connect the sensor unit 500 to the positive 502 and negative 503 terminals of battery 501 under test. In a preferred embodiment, the sensor unit 500 is mechanically and electrically attached to the negative terminal 502 of a battery 501 by means of the second mounting tab 505. In the alternative, the sensor unit 500 could be designed for connecting the second mounting tab 505 to the positive terminal 503. The sensor unit may be connected to the other devices, such as other sensors or a control unit, by one or more communications cables 505. The sensor unit 500 may measure the battery's 501 terminal post temperature, terminal voltage, and other variables that are descriptive of the internal parameters of the battery. The operating power for sensor 500 may be obtained from the battery 501 to which it is connected.

Figure 6:
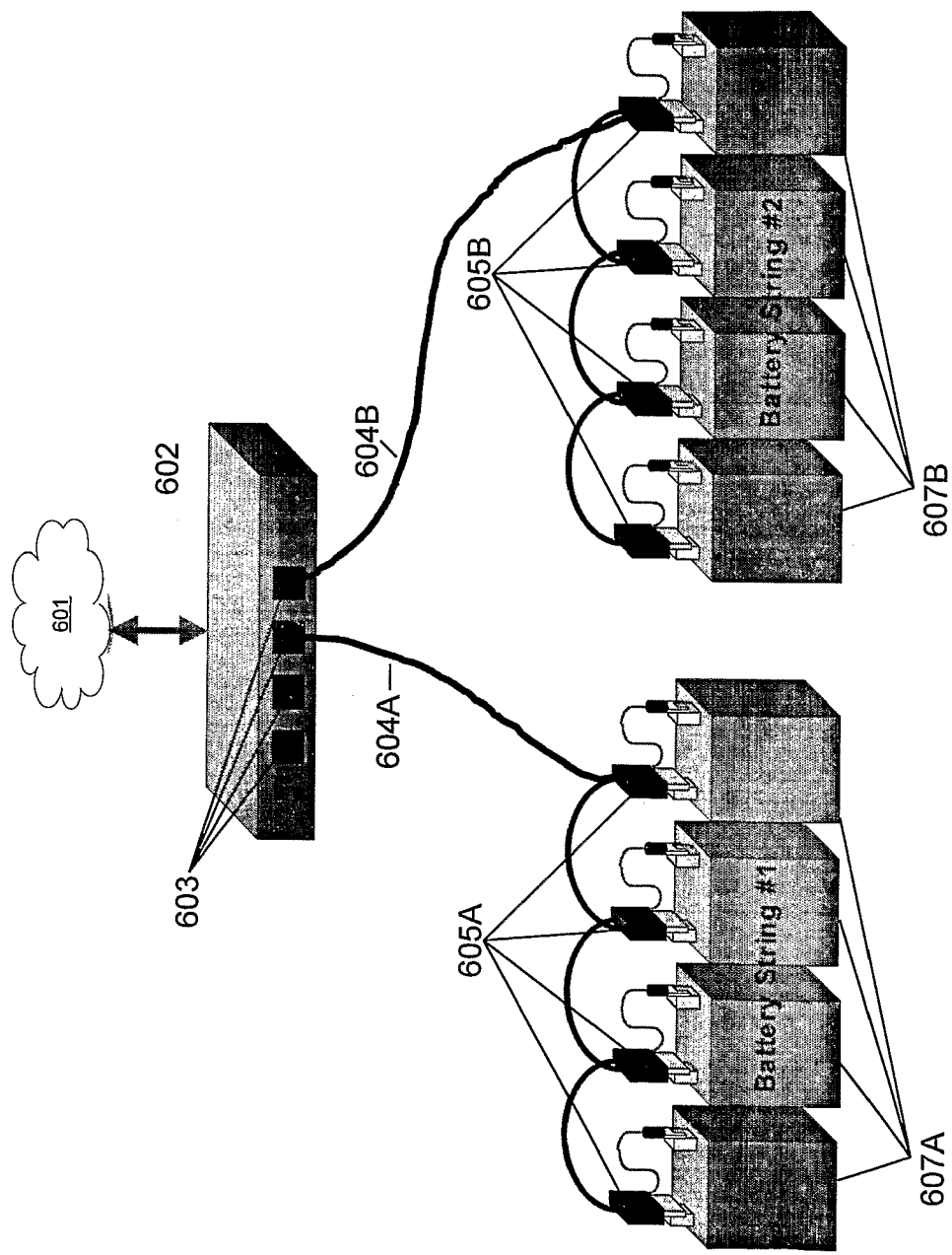
FIG. 6 depicts a remote measurement system.

FIG. 6 shows two strings of batteries 607A-B being monitored by an exemplary remote battery monitoring system. Batteries 607A may be connected in series to form a first battery string. Likewise, batteries 607B may connected in series to form a second battery string. Each battery 607A-B in each string may be connected to a sensor unit 605A-B. Each sensor unit within the first string 607A may be interconnected via a communications cable 604A. Likewise, each sensor unit within the second string 607B may be interconnected via a communications cable 604B. Communications cables 604A-B may be four-conductor telephone cables or any other cable suitable for data transmission. Communication cables 604A-B enable data communication between the sensor units 605A-B and a site control unit 602. This communication may be serial and/or parallel data communication. Strings of sensor units 605A-B may be connected to the site control unit 602. The site control unit 602 may include a number of interfaces 603 to support many communication cables 604A-B and in turn many batteries 607A-B under test. The site control unit 602 may be connected to a data network 601. The data network 601 may be an Internet Protocol (IP) network or it may use another network protocol. The data network may employ T1, ISDN, DSL, broadband, Ethernet, WiFi, or other transport suitable for data transfer.

Each sensor unit 605A-B may test its respective battery 607A-B and may communicate data indicative of the battery's condition to the site control unit 602. This data may include, but is not limited to, values representative of the overall voltage of the battery string, the relative position of the sensor unit within the string, the Vtdelta of the respective battery, the Rt of the respective sensor, and the calibration constant pre-programmed in the respective sensor. The site control unit 602 subsequently performs mathematical calculations on the received data to report metrics indicative of battery condition. The site control unit may report the battery metrics via the data network 601. It may provide an regular report via file transfer protocol (FTP), Hypertext Transport Protocol (HTTP), and/or another protocol. It may provide the metrics as requested or polled by a user or management system via Simple Network Management Protocol (SNMP) or other protocol. The site control unit 602 may include a web server to display battery metrics and to receive management controls.

Each sensor unit 605A-B within a string may determine the total voltage of the respective string of batteries 607A-B. This may be implemented via circuitry related to diode 407 in each sensor. Within a string, each sensor unit's cathode of diode 407 may sum the batteries voltages at a defined pin of the first 408 and second 409 interface port. The site controller 602 may measure this voltage with respect to the string of batteries' overall minus voltage. The result is a overall voltage of the string. The site controller 602 may report this voltage to all sensors 605A-B within the string via a broadcast message over the communication cable 604A-B.

Each sensor 605A-B may determine its relative position within the respective string of batteries 607A-B. This may be implemented via circuitry related to diode 407 in each sensor. Within a string, each sensor unit's cathode of diode 407 may sum the batteries voltages at a defined pin of the first 408 and second 409 interface port. Each sensor 605A-B may measure this local voltage relative to the respective battery's minus voltage terminal 402. Each sensor unit 605A-B may divide the measured local voltage by the overall battery string voltage, received from the site controller unit 602. The result is a value representative of the relative position of the sensor unit 605A-B. Once each sensor unit 605A-B determines its relative position within the string, it may assume a logical address for purposes of communications with the site controller 602.

Figure 7A:
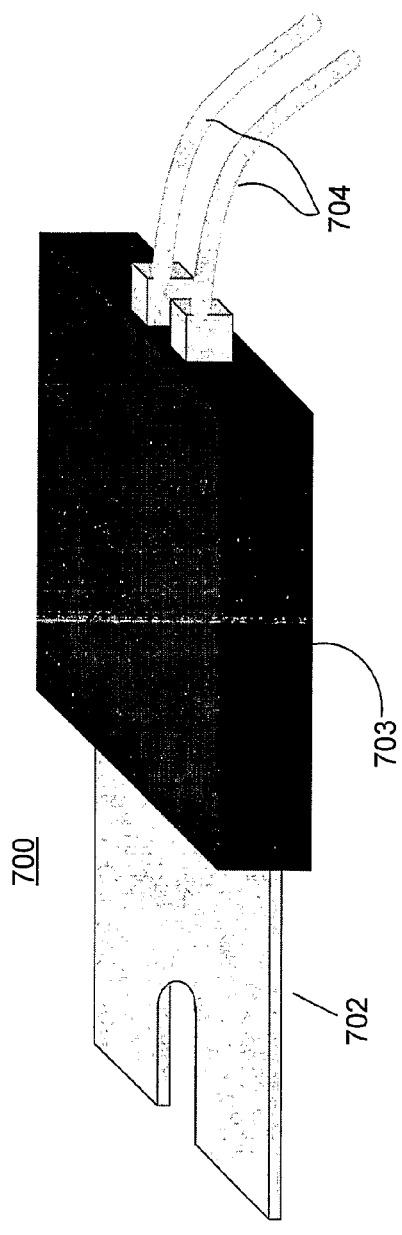
FIGS. 7A and 7B illustrate a remote measurement sensor in perspective and "x-ray" views, respectively.
Figure 7B:
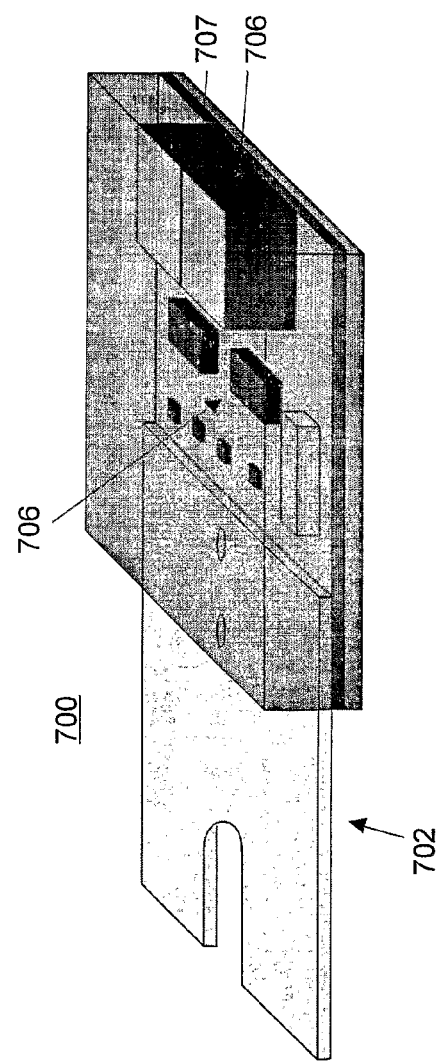

FIGS. 7A and 7B show a perspective view and an "x-ray" view of an exemplary sensor unit 700. The sensor unit 700 may include a thermally and electrically conductive mounting tab 702. The mounting tab 702 may provide a mechanical, thermal, and electrical connection to a battery terminal. For clarity, a second mounting tab for connecting to a second battery terminal is not shown in the figure. The mounting tab 702 may extend from the sensor unit body 703. The body may be a housing made of plastic or other material. The sensor unit body 703 may house the sensor circuit 706. The sensor circuit may be a printed circuit board, a breadboard, or other physical implementation. The sensor circuit may include a first 706 and second 707 parallel, optically isolated RJ-11 jacks. Other electrical and optical jacks, such as RJ-45, Lucent Connector (LC), and Ferrule Connector (FC), suitable for data transmission may be used as well. Each may receive a respective communications cable 704. Each communications cable 704 may enable interconnection with other sensors as well as with the site controller 602.

Figure 8:
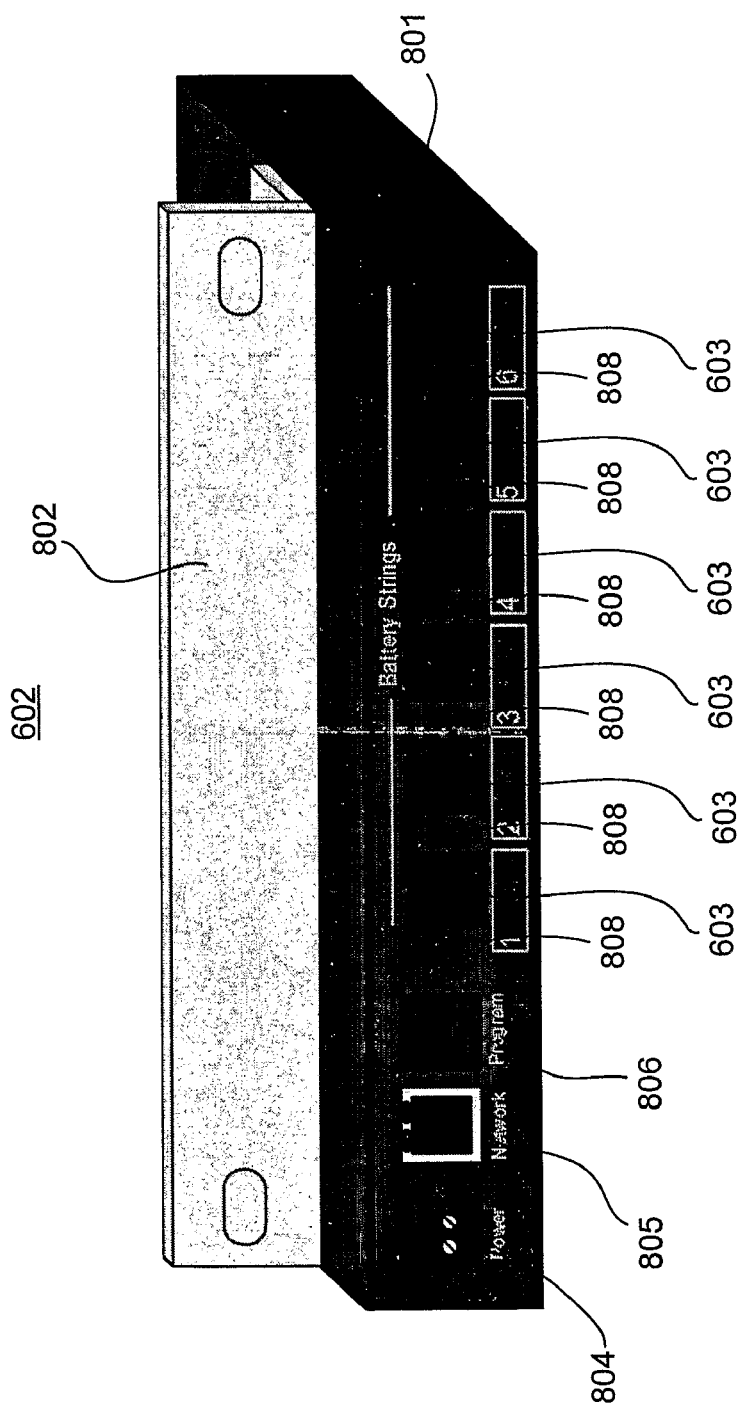
FIG. 8 depicts a perspective view of a site control unit.

FIG. 8 depicts a perspective view of an exemplary site controller 602. The site controller may be contained in a housing 801. The housing 801 may be suitable for containing electrical equipment and may be made of metal or plastic for example. The housing 801 may include one or more mounting features 802 for data center and telecom rack mounting, for example.

The site controller 602 may provide one or more sensor interfaces 603 to interconnect the site controller 602 with one or more communication cables 604A-B. Each sensor interface 603 may be an RJ-11 jack; other electrical or optical jack, such as RJ-45, Lucent Connector (LC), and Ferrule Connector (FC), suitable for data transmission may be used as well. Each sensor interface 603 may include a data link light 808.

Each data link light 808 may illuminate, flash, or change color to indicate the status of the respective sensor interface 603. The data link light 808 may be a light emitting diode or the like.

The site controller 602 may also include a network interface 805, such as an RJ-45 Ethernet jack for example. The data interface may be suitable for T1, ISDN, DSL, broadband, Ethernet, WiFi, or other data transport networks. The site controller 602 may include the appropriate interface circuitry to enable the network interface 805.

The site controller 602 may include a program interface 806 such as an RJ-45 jack for example. The program interface 806 may be provided for the purpose of connecting a portable computer directly to the site controller for diagnostic tests, locally re-loading the operating software, locally loading configuration data, and other tasks. The site controller 602 may include the appropriate interface circuitry to enable the program interface 806.

The site controller 602 may include a power interface 804. The power interface 804 may enable connection to commercial AC power, via NEMA 1-15 or NEMA 5-15 plug types for example. In the alternative, the power interface may enable connection to central office DC power, or any other power connection used in the alt.

Figure 9:
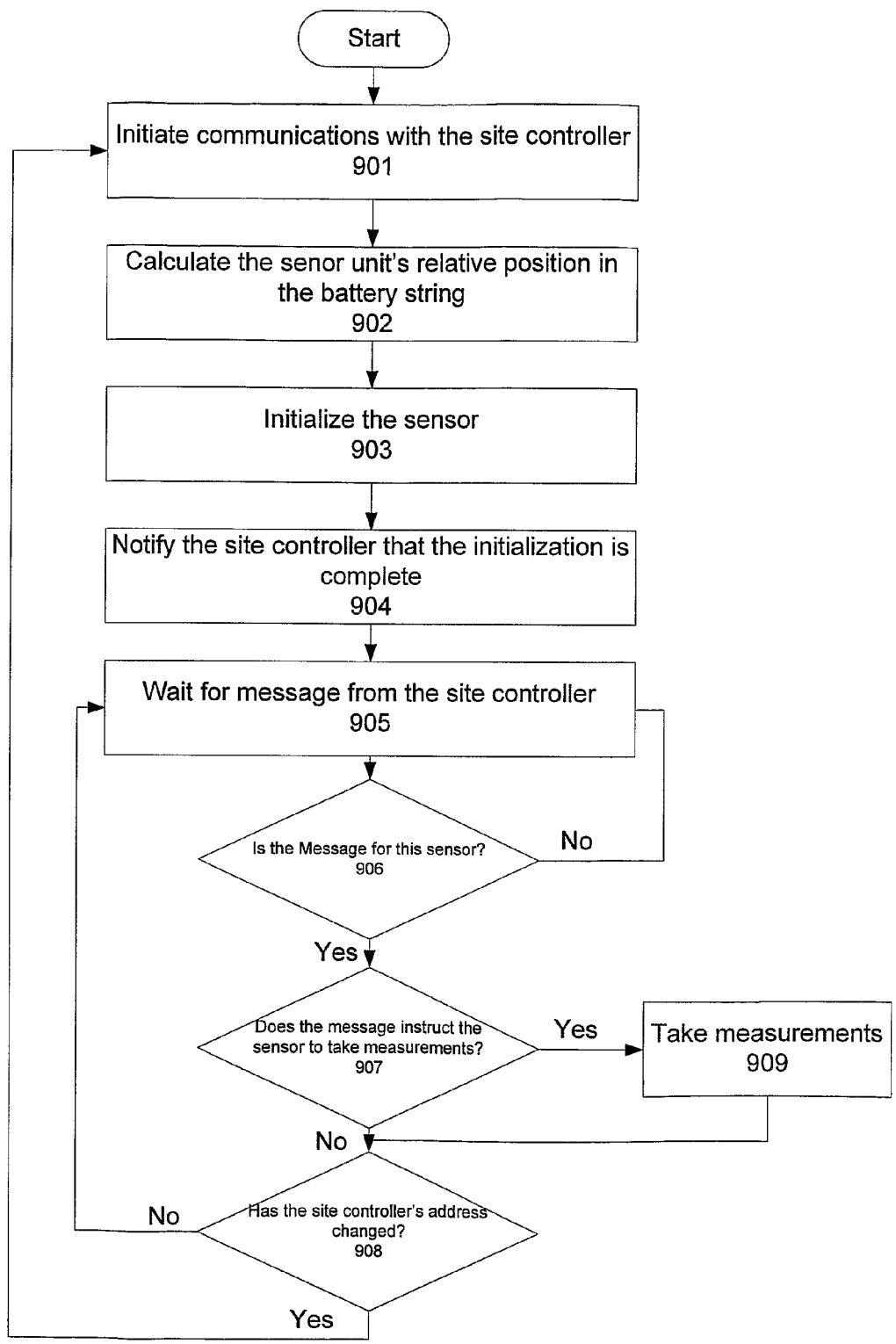
FIG. 9 is a functional flow of sensor unit operation.

FIG. 9 depicts a exemplary process 900 related to the operation and function of the sensor unit 605A-B. Each sensor unit 605A-B may implement the process 900 via the microcontroller 410, for example. The process 900 may implemented in a software module or an application specific integrated circuit. When each sensor unit 605A-B begins operation, the sensor unit 605A-B may initiate communication 901 with the site controller 602. This initial communication 901 may include handshaking or the like. Next, the sensor unit 605A-B may calculate its relative position 902 within the respective battery string. The sensor may use this relative position as a logical address for messaging with the site controller 602. The sensor unit 605A-B may complete initialization 903 and report that initialization is complete 904 to the site controller 602. At this point, the sensor unit 605A-B may wait for a message 905 from the site controller 602.

Upon receiving a message, the sensor unit 605A-B determines 906 whether the message is destined for it or another sensor unit 605A-B. The sensor unit 605A-B may compare the address specified in the message with its own logical address. If the addresses are different, the message is destined for another sensor unit 605A-B. The sensor unit 605A-B may discard the message and return to waiting 905 for a message from the site controller 602. If the addresses are the same, the message is processed 907 by the sensor unit 605A-B. The message may request the sensor to take measurements 909, to perform other processes, or to indicate that the site controller's address has changed 908. The sensor unit 605A-B will process the message appropriately. If the site controller's address has changed, the sensor unit 605A-B may repeat the initialization sequence 901. If the site controller's address has not changed, the sensor unit 605A-B may wait 905 for another message from the site controller 602.

What is claimed is:

1. A system for monitoring a power source, comprising:
    a first power source;
    a second power source in communication with the first power source;
    a first sensor in communication with the first power source, wherein the first sensor calculates an exponential discharge characteristic of the first power source;
    a second sensor in communication with the second power source, wherein the second sensor calculates an exponential discharge characteristic of the second power source; and
    a controller in communication with the first sensor via the second sensor, wherein the controller determines characteristics of the first power source as a function of the exponential discharge characteristic of the first power source.

2. The system of claim 1, wherein the controller receives data related to the first and second power source.

3. The system of claim 1, wherein the controller transmits a command to the first and second sensors.

4. The system of claim 1, wherein the controller is in communication with a network.

5. The system of claim 1, wherein the controller distinguishes the first sensor from the second sensor.

6. The system of claim 5, wherein the controller distinguishes the first sensor from the second sensor as a function of at least one of the following: a location, an installation time, and a unique address.

7. The system of claim 5, wherein the controller communicates with the first and second sensor as a function of the distinguishing.

8. The system of claim 1, wherein the controller measures a first voltage of the first power source and a second voltage of the second power source, and wherein the controller combines the first and second voltages to determine at least one of the following: a first parameter of the first power source and a second parameter of the second power source.

9. The system of claim 8, wherein the first parameter comprises a capability of the first power source to deliver power to a load.

10. The system of claim 8, wherein the second parameter comprises a capability of the second power source to deliver power to a load.

11. The system of claim 8, wherein the controller communicates the combined first and second voltages to the first sensor and the second sensor.

12. The system of claim 1, wherein the first sensor measures at least one of the following of the first power source: voltage, temperature, and resistance.

13. The system of claim 1, wherein the second sensor measures at least one of the following of the second power source: voltage, temperature, and resistance.

14. The system of claim 1, wherein the first and second power sources are batteries.

15. The system of claim 1, wherein the first sensor measures a first voltage of the first power source at a first time.

16. The system of claim 15, wherein the first time is subsequent to adding a load to the first power source.

17. The system of claim 15, wherein the second sensor measures a second voltage of the second power source at a second time, wherein the second time is subsequent to the first time.

18. The system of claim 1, wherein the first sensor measures a first voltage of the first power source at a first time, and wherein second sensor measures a second voltage of the second power source at a second time, and wherein the first and second voltages are measured more than once.

19. The system of claim 18, wherein the first and second voltage measurements are averaged.

20. A method of monitoring a power source, comprising:
    calculating, via a microcontroller associated with a first sensor, an exponential discharge characteristic of a first power source;

calculating, via a microcontroller associated with a second sensor, an exponential discharge characteristic of a second power source; and determining, via a controller, a characteristic of the first power source as a function of the exponential discharge characteristic of the first power source, wherein said characteristic of the first power source is received via the second sensor.

21. The method of claim 20, further comprising receiving data related to the first and second power source.

22. The method of claim 20, further comprising transmitting a command to the first and second sensors.

23. The method of claim 20, further comprising communicating the characteristic of the first power source via a network.

24. The method of claim 20, further comprising distinguishing the first power source from the second power source.

25. The method of claim 24, wherein the distinguishing is accomplished as a function of at least one of the following: a location, an installation time, and a unique address.

26. The method of claim 24, further comprising communicating with the first and second power sources as a function of the distinguishing.

27. The method of claim 20, further comprising measuring a first voltage of the first power source and a second voltage of the second power source, and combining the first and second voltages to determine at least one of the following: a first parameter of the first power source and a second parameter of the second power source.

28. The method of claim 27, further comprising communicating the combined first and second voltages to the first power source and the second power source.

29. The method of claim 20, further comprising measuring at least one of the following of the first power source: voltage, temperature, and resistance.

30. The method of claim 20, further comprising measuring at least one of the following of the second power source: voltage, temperature, and resistance.

31. The method of claim 20, wherein the first and second power sources are batteries.

32. The method of claim 20, further comprising measuring a first voltage of the first power source at a first time.

33. The method of claim 32, wherein the first time is subsequent to adding a load to the first power source.

34. The method of claim 32, further comprising measuring a second voltage of the first power source at a second time, wherein the second time is subsequent to the first time.

35. The method of claim 20, further comprising measuring a first voltage of the first power source at a first time, and measuring a second voltage of the second power source at a second time, wherein the first and second voltages are measured more than once.

36. The method of claim 35, further comprising averaging the first and second voltage measurements.

* * * * *

UNITED STATES PATENT AND TRADEMARK OFFICE
CERTIFICATE OF CORRECTION

PATENT NO.        : 7,970,560 B2                      Page 1 of 1
APPLICATION NO.   : 12/089745
DATED             : June 28, 2011
INVENTOR(S)       : Joseph D. Rocci et al.

It is certified that error appears in the above-identified patent and that said Letters Patent is hereby corrected as shown below:

COVER PAGE, at (57) ABSTRACT, delete "(905)" after "controller"; delete "(902)" after "second power source"; delete "(901)" after "first power source" at the very end of the Abstract.

Signed and Sealed this
Tenth Day of July, 2012

David J. Kappos
*Director of the United States Patent and Trademark Office*